United States Patent
Lee et al.

(10) Patent No.: US 12,149,232 B2
(45) Date of Patent: *Nov. 19, 2024

(54) MULTI-VOLTAGE BOOTSTRAPPING DRIVERS

(71) Applicant: Efficient Power Conversion Corporation, El Segundo, CA (US)

(72) Inventors: Edward Lee, Fullerton, CA (US); Michael Chapman, Long Beach, CA (US); Ravi Ananth, Laguna Niguel, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 18/062,698

(22) Filed: Dec. 7, 2022

(65) Prior Publication Data

US 2023/0179195 A1 Jun. 8, 2023

Related U.S. Application Data

(60) Provisional application No. 63/287,213, filed on Dec. 8, 2021.

(51) Int. Cl.
*H03K 17/06* (2006.01)
(52) U.S. Cl.
CPC ... *H03K 17/063* (2013.01); *H03K 2217/0063* (2013.01); *H03K 2217/0072* (2013.01)
(58) Field of Classification Search
None
See application file for complete search history.

(56) References Cited

U.S. PATENT DOCUMENTS

| | | | | |
|---|---|---|---|---|
| 4,680,488 A | * | 7/1987 | Okumura | H03K 19/01735 326/88 |
| 5,821,769 A | * | 10/1998 | Douseki | H03K 19/0016 326/121 |
| 10,790,811 B2 | | 9/2020 | Lee et al. | |
| 2013/0241601 A1 | | 9/2013 | Chen et al. | |
| 2014/0217959 A1 | | 8/2014 | Chen et al. | |
| 2019/0123740 A1 | | 4/2019 | Chern et al. | |

FOREIGN PATENT DOCUMENTS

| EP | 2 302 772 A1 | 3/2011 |
|---|---|---|
| WO | WO 2013/138750 A1 | 9/2013 |

* cited by examiner

*Primary Examiner* — Kenneth B Wells
(74) *Attorney, Agent, or Firm* — Blank Rome LLP

(57) ABSTRACT

A bootstrapping circuit that utilizes multiple pre-charged capacitor voltages and applies the capacitor voltages to the high side FET of a GaN bootstrapping driver. During the pre-charging phase of the bootstrapping driver, multiple capacitors are charged in parallel to the supply voltage. During the driving phase of the bootstrapping driver, the capacitors are connected in series through a number of FETs and connected to the gate terminal of the high side FET of the bootstrapping driver. As a result, the gate-to-source voltage of the high side FET is equal to or greater than the supply voltage during the driving phase, increasing the driving capability of the high side FET and reducing the total required capacitance and die area of the bootstrapping driver.

7 Claims, 4 Drawing Sheets

MULTI-VOLTAGE BOOTSTRAPPING DRIVERS

This application claims the benefit of U.S. Provisional Application No. 63/287,213 filed Dec. 8, 2021, the disclosure of which is incorporated by reference in its entirety.

BACKGROUND OF THE INVENTION

Typical FET gate drivers rely on a bootstrapping circuit to provide an increased voltage to a gate terminal of the high side FET. Bootstrapping gate drivers store energy in capacitors while an associated high side FET is turned off, and use the stored energy to apply a voltage greater than a supply voltage to the gate terminal of the high side FET, keeping it turned on despite increases in voltage on a source terminal of the high side FET.

FIG. 1 is a schematic of a conventional bootstrapping gate driver for a high side power FET. In FIG. 1, system 100 includes a bootstrapping gate driver 170, a high side FET 185, a low side FET 192 and an output. Bootstrapping gate driver 170 is coupled to the gate terminal of high side FET 185. The drain terminal of FET 185 is coupled to a supply voltage source $V_{dd}$, and the source terminal of high side FET 185 is coupled to a load (not shown) at the output. Bootstrapping gate driver 170 receives a control signal at the input and drives high side FET 185 based on the input. A logic high input is indicative that high side FET 185 is to be turned off, and a logic low input is indicative that FET 185 is to be turned on. FET 185 acts as a closed switch, connecting a load at the output to supply voltage $V_{dd}$, based on the output from bootstrapping gate driver 170 and the input.

Bootstrapping gate driver 170 includes FET 120 and diode-connected FET 135, resistor 145, and capacitor 150. The gate terminal of FET 120 receives the input, and the source terminal of FET 120 is coupled to ground. The drain terminal of FET 120 is coupled to resistor 145 at node 155. Resistor 145 is further coupled to the source terminal of FET 135 at node 140. The gate terminal and the drain terminal of FET 135 are shorted together, configuring FET 135 as a diode, and coupled to supply voltage $V_{dd}$. Alternatively, diode-connected FET 135 can be replaced with a diode with its anode connected to $V_{dd}$ and its cathode connected to node 140.

Capacitor 150 is coupled between node 140 and the output. The gate terminal of high side FET 185 is coupled to node 155.

In response to a logic high input, FET 120 acts as a closed switch connecting node 155 to ground, causing high side FET 185 to turn off and act as an open switch and disconnecting the output from supply voltage $V_{dd}$. Capacitor 150 is charged from supply voltage $V_{dd}$ via diode-connected FET 135 and FET 192.

In response to the input being logic low, FET 120 acts as an open switch, disconnecting node 155 from ground. Diode-configured FET 135 and pullup resistor 145 increase the voltage on node 155 above the threshold voltage $V_{Th}$ of high side FET 185 and turn it on. High side FET 185 then acts as a closed switch and connects the output to supply voltage $V_{dd}$. As the voltage on the output increases, energy stored in capacitor 150 discharges through node 140, pull up resistor 145, and node 155, which increases the voltage on nodes 140 and 155. As the voltage on the output approaches the supply voltage $V_{dd}$, the voltage on node 155 increases to approximately the voltage on the output plus the voltage across capacitor 150, above the supply voltage $V_{dd}$. The increased voltage above $V_{dd}$ on node 155 and the low on-resistance of high side FET 185 keeps high side FET 185 turned on as the voltage on its source terminal increases to approximately $V_{dd}$.

A turn-off FET 192 is incorporated into the system. The gate terminal of FET 192 receives the input, and the source terminal of FET 192 is coupled to ground. The drain terminal of FET 192 is coupled to the output. In response to input being logic high, FET 192 acts as a closed switch, connecting the output to ground, and quickly decreasing the voltage at the output from approximately $V_{dd}$ to ground.

Bootstrapping gate driver 170 advantageously balances static currents during turn-off of high side FET 185 with the length of the turn-on time using resistor 145. A larger resistance for resistor 145 decreases static currents in bootstrapping gate driver 170 and reduces the overall power consumption of bootstrapping gate driver 170, but also slows the turn-on of high side FET 185.

For a logic high input, FETs 120 and 192 are on. Hence, the voltage at node 155 and the voltage at the output are at ground. The bootstrap capacitor 150 is charged to $V_{dd}-V_{GS\_135}$, where $V_{GS\_135}$ is the gate-to-source voltage of FET 135. If $V_{GS\_135}$ is assumed to be zero, the bootstrap capacitor will be charged to $V_{dd}$. Circuitry for eliminating $V_{GS\_135}$ is disclosed in co-pending U.S. application Ser. No. 18/062,660, entitled "Active Bootstrapping Drivers", the disclosure of which is incorporated by reference.

For a logic low input, FETs 120 and 192 are off. The voltage on the bootstrap capacitor 150 is applied to the $V_{GS}$ of high side FET 185 ($V_{GS\_185}$) via resistor 145, with the voltage at node 140 equal to the voltage at node 155 and turning on high side FET 185. The output will increase to $V_{dd}$ when the voltage at node 140 and the voltage at node 155 go above $V_{dd}$ due to the voltage stored on the bootstrap capacitor 150.

For a given bootstrap capacitor 150 having capacitance of $C_{BS}$ and a high side FET 185 having a gate-to-source capacitance of $C_{GS\_185}$, the gate-to-source voltage on high side FET 185 ($V_{GS\_185}$) will be equal to $V_{dd} \cdot C_{BS}/(C_{BS}+C_{GS\_185})$ for a logic low input. A lower $V_{GS\_185}$ when the input is a logic low leads to slower pulling "out" to $V_{dd}$.

The prior art bootstrapping circuit of FIG. 1 has the following disadvantages:

1. The bootstrap capacitor 150 must have a much greater capacitance than the gate-to-source capacitance of high side FET 185 ($C_{GS\_185}$) to achieve a gate-to-source voltage on high side FET 185 ($V_{GS\_185}$) close to $V_{dd}$. For example, if $C_{BS}$ is nine times greater than $C_{GS\_185}$, the gate-to-source voltage on high side FET 185 ($V_{GS\_185}$) will be $0.9 \cdot V_{dd}$ for a logic low input. Hence, a large area is required for the bootstrap capacitor 150.

2. Also, the circuit of FIG. 1 requires a small resistor 145 to achieve fast settling on $V_{GS\_185}$ when the input is a logic low, which leads to high static power dissipation when the input is a logic high.

This second disadvantage noted above can be alleviated to a degree using a cascaded bootstrapping driver circuit 290 as shown in FIG. 2. In the final stage 285 of the bootstrapping driver circuit 290 of FIG. 2, the bootstrap resistor 145 is replaced with a FET 265, where the size of FET 265 is much less than the size of high side FET 294.

FET 265 is driven by a preceding (initial) bootstrapping stage 250. For a logic low input (0 volts), the gate voltage of FET 265 is greater than the voltage on node 260 by approximately $V_{dd}$, and increases in voltage when the voltage on node 260 increases in voltage because FET 265 is turned on. The increase in voltage at node 260 turns on high side FET 294 and the output voltage also increases. The voltages at nodes 240 and 270 are driven above $V_{dd}$, such that the output will be driven to about $V_{dd}$.

For a logic high input, FETs 265 and 294 are both off, and static current is only drawn through resistor 230, FET 235 and FET 220.

Since the size of FET 265 is much less than the size of high side FET 294, the bootstrap capacitor 245 can advantageously be much smaller than bootstrap capacitor 280.

The cascaded bootstrap circuit of FIG. 2 has the following additional advantages over the bootstrap circuit of FIG. 1:

1. The channel resistance ($R_{DS\_on}$) of FET 265 is much smaller than the resistance of resistor 145 in the circuit of FIG. 1, such that high side FET 185 can be turned on in a much shorter time.

2. Resistor 230 can be much larger to reduce current consumption with a far lower penalty on the turn-on time of FET 265 (and also FET 294) due to the smaller size of FET 265.

However, the cascaded bootstrap circuit of FIG. 2 still suffers from the same two disadvantages of the bootstrap circuit of FIG. 1, except that the static power dissipation is reduced due to larger bootstrap resistor 230.

SUMMARY OF THE INVENTION

The present invention provides a multi-voltage bootstrapping gate driver circuit for a high side FET that overcomes the above-noted deficiencies of the prior art. Specifically, the present invention comprises a plurality of bootstrapping stages, each having a bootstrap capacitor. The bootstrap capacitors are charged in parallel from a supply voltage when the logic level on the input corresponds to a charging phase. When the logic level on the input changes to a driving phase, the FET switches of the bootstrapping gate driver circuitry cause the bootstrap capacitors to be electrically connected in series and apply the additive capacitor voltages to the high side FET. As a result, the gate-to-source voltage of the high side FET is equal to or greater than the supply voltage during the driving phase, increasing the driving capability of the high side FET and reducing the total required capacitance and die area of the bootstrapping driver.

The present invention can be provided in a cascaded bootstrapping embodiment to achieve low power consumption.

BRIEF DESCRIPTION OF THE DRAWINGS

The above features, objects, and advantages of the present disclosure will become more apparent from the detailed description set forth below when taken in conjunction with the drawings, in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 3:
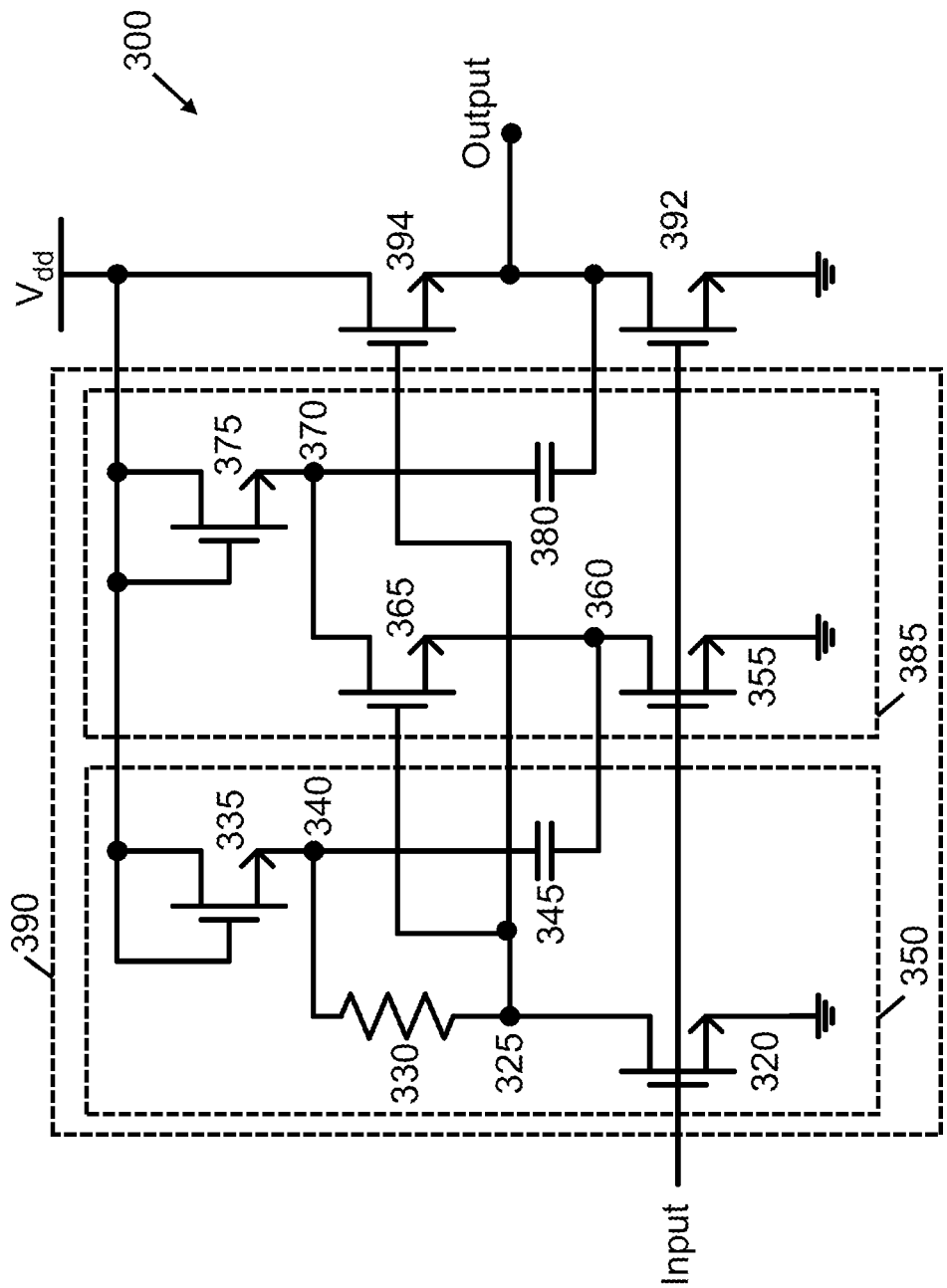
FIG. 3 is a schematic of a multi-voltage bootstrapping gate driver circuit in accordance with a first embodiment of the present invention.

FIG. 3 illustrates a bootstrapping gate driver 390 according to a first embodiment of the present invention. The gate driver circuit 300 includes the bootstrapping gate driver 390, a high side (pull-up) FET 394, a low side (turn-off) FET 392, and an output to be connected to a load (not shown). Turn-off FET 392 and high side FET 394 (and all FETs in the circuits described below) are preferably enhancement mode gallium nitride (GaN) FETs, which are monolithically integrated with cascaded bootstrapping gate driver 390 onto a single semiconductor die. Because GaN FETs are able to carry large currents, support high voltages, and switch more quickly than conventional FETs, gate driver circuit 300 provides quicker turn-on and turn-off times than a similar circuit implementing other transistors, such as MOSFETs.

Bootstrapping gate driver 390 is coupled to a gate terminal of high side FET 394. The drain terminal of high side FET 394 is coupled to a voltage source which provides a supply voltage $V_{dd}$, and the source terminal of high side FET 394 is coupled to a load at the output. Bootstrapping gate driver 390 receives a control signal via the input and drives high side FET 394 based on the input (logic low or logic high). A logic high input is indicative that high side FET 394 is to be turned off, and a logic low input is indicative that high side FET 394 is to be turned on.

In a driving mode, when the input is a logic low, high side FET 394 acts as a closed switch, connecting the output (and an associated load, not shown) to supply voltage $V_{dd}$ based on the output from bootstrapping gate driver 390. The drain terminal of turn-off FET 392 is coupled to the output, and the source terminal of turn-off FET 392 is coupled to ground. The gate terminal of turn-off FET 392 receives a control signal on the input. In response to the input being logic high, turn-off FET 392 acts as a closed switch, connecting the output to ground, speeding a decrease in a voltage on the output from approximately Vdd to ground.

Bootstrapping gate driver 390 includes an initial bootstrapping stage 350 and a secondary bootstrapping stage 385. The initial bootstrapping stage 350 includes FETs 320 and 335, a resistor 330, and a capacitor 345. The secondary bootstrapping stage 385 includes FETs 355, 365, and 375 and capacitor 380. FETs 320, 335, 355, 365, and 375 are preferably enhancement mode GaN FET semiconductor devices, which are monolithically integrated onto a single semiconductor die with the other components of system 300. As described previously herein with reference to turn-off FET 392 and high side FET 394, GaN FETs switch more quickly than conventional FETs and allow bootstrapping gate driver 390 to turn high side FET 394 on and off more quickly than a similar system implementing other transistors, such as MOSFETs.

In initial bootstrapping stage 350, the gate terminal of FET 320 receives the input control signal, and the source terminal of FET 320 is coupled to ground. The drain terminal of FET 320 is coupled to resistor 330 at node 325. Resistor 330 is further coupled to the source terminal of FET 335 at node 340. The gate terminal and the drain terminal of FET 335 are coupled to supply voltage $V_{dd}$, configuring FET 335 as a diode. Capacitor 345 is coupled to node 340 and to node 360 in the secondary bootstrapping stage 385.

The secondary bootstrapping stage 385 is similar to initial bootstrapping stage 350 but substitutes FET 365 for resistor 330. FET 365 is smaller than high side FET 394, and the gate terminal of FET 365 is driven by initial bootstrapping stage 350. The gate terminal of FET 355 receives the input control signal, and the source terminal of FET 355 is coupled to ground. The drain terminal of FET 355 is coupled to the source terminal of FET 365 at node 360. The gate terminal of FET 365 is coupled to node 325 in initial bootstrapping stage 350, and the drain terminal of FET 365 is coupled to the source terminal of FET 375 at node 370. The gate terminal and the drain terminal of FET 375 are coupled to the supply voltage $V_{dd}$, configuring FET 375 as a diode. Capacitor 380 is coupled to the output. The gate terminal of high side FET 394 is coupled to node 325.

In response to the input being logic high, FETs 320, 355 and 392 act as closed switches. FET 320, acting as a closed switch, connects node 325 to ground, decreasing the voltage on node 325. FET 355, acting as a closed switch, connects node 360 to ground, decreasing the voltage on node 360. The decreasing voltage on node 325 at the gate terminal of FET 365 and on node 360 at the source terminal of FET 365 turns off FET 365. Turn-off FET 392, acting as a closed switch, connects the output to ground, decreasing the voltage on the output. The decreasing voltage on node 325 at the gate terminal of high side FET 394 and on the output at the source terminal of high side FET 394 turns off high side FET 394, disconnecting the output from the supply voltage source 310. Charge is stored in capacitor 345 from the supply voltage $V_{dd}$ through diode-connected FET 335 and FET 355. Similarly, charge is stored in capacitor 380 from the supply voltage $V_{dd}$ through diode-connected FET 375 and turn-off FET 392. The voltages across capacitors 345 and 380 are increased to approximately $V_{dd}-V_{Th}$, due to the threshold voltage drop across the diode-connected FET 335 or 375, respectively. Static current is drawn only through resistor 330 and FETs 335 and 320.

In response to the input being logic low, FETs 320, 355, and 392 act as open switches. FET 392, acting as an open switch, disconnects the output from ground, allowing the voltage on the output to increase. FET 320, acting as an open switch, disconnects node 325 from ground. The initial voltage on node 340 is approximately equal to $V_{dd}-V_{Th}$, due to the threshold voltage drop across FET 335, and increases the voltage on node 325 through resistor 330. As the voltage on node 325 increases above $V_{Th}$, FETs 365 and 394 turn on. FET 355, acting as an open switch, disconnects node 360 from ground, allowing the voltage on node 360 to increase as FET 365 turns on and current flows from supply voltage $V_{dd}$ through FETs 375 and 365 to node 360. High side FET 394 acts as a closed switch and connects the output to the supply voltage $V_{dd}$. As the voltage on the output increases, charge stored in capacitor 380 increases the voltage on node 370 proportionally, such that the voltage on node 370 is approximately equal to the voltage on output plus $V_{dd}-V_{Th}$. Because FET 365 is on, the voltage on node 360 is substantially equal to the voltage on node 370 and increases proportional to the increase in voltage on the output. As the voltage on node 360 increases, energy stored in capacitor 345 increases the voltage on node 340 proportionally, such that the voltage on node 340 is approximately equal to the voltage stored on capacitor 380 plus the voltage stored on capacitor 345, which are connected in series. The increase in voltage on node 340 increases the voltage on node 325 through resistor 330. The increase in voltage on node 325, which is electrically connected to the gate terminal of FET 365 and to the gate terminal of high side FET 394 keeps those FETs on. Keeping FET 365 turned on keeps node 370 and node 360 electrically connected together, such that the $V_{GS}$ of high side FET 394 is substantially equal to the voltage across capacitor 380 added to the voltage across capacitor 345, and high side FET 394 remains turned on. No static current is drawn.

In response to the input being logic low and FET 365 acting as a closed switch that electrically connects node 370 and node 360, the charge on capacitor 380 and the charge on capacitor 345 is redistributed between capacitors 380, 345 and the gate-to-source capacitance of high side FET 394. The resulting $V_{GS}$ of high side FET 394 is equal to the voltage across capacitor 380 plus the voltage across capacitor 340.

Figure 1:
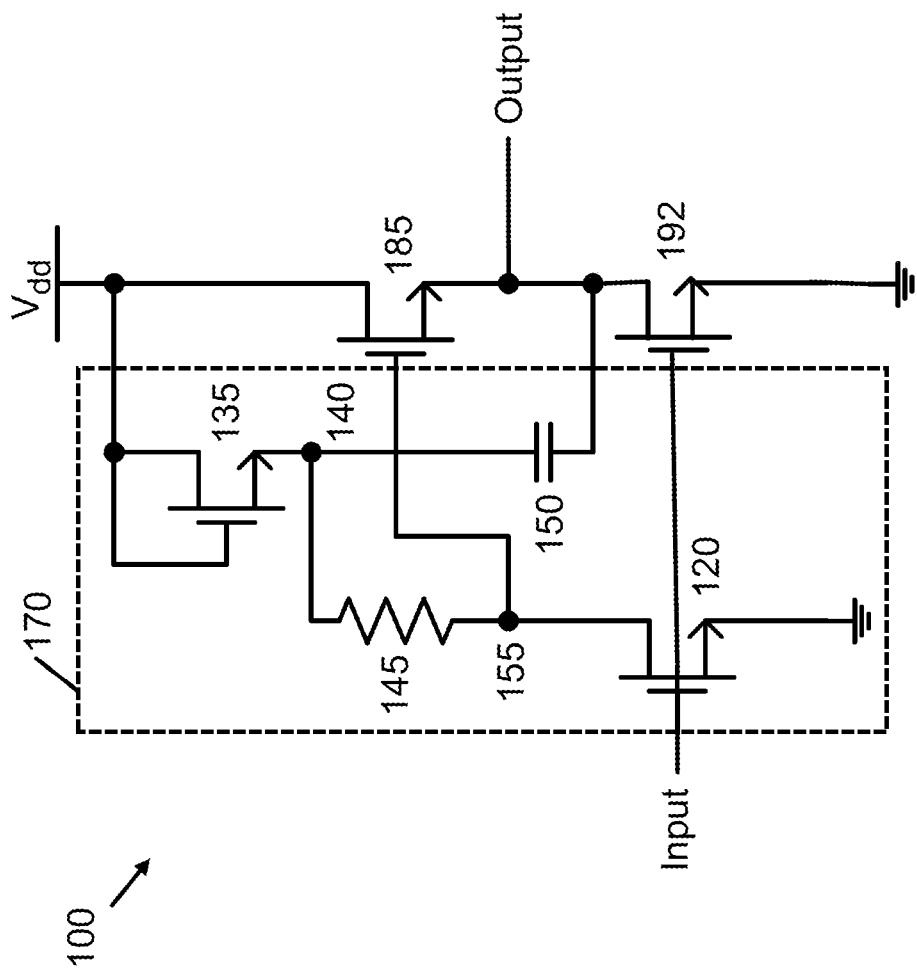
FIG. 1 is a schematic of a conventional bootstrapping gate driver circuit.

By using a bootstrapping driver with multiple bootstrap capacitors, the total capacitance required in the bootstrapping driver circuit of FIG. 1 is advantageously reduced and the gate-to-source voltage of high side FET 394, which is normally equal to or less than $V_d$, is equal to or even higher than $V_{dd}$, as explained below.

For a logic high input (i.e., the charging phase of the bootstrapping driver), the output, node 360 and node 325 are at ground since FETs 320, 355 and 392 are on. Both bootstrap capacitors 345 and 380 are charged to about $V_{dd}$ through FETs 375 and 392 and FETs 335 and 355, respectively, if the threshold voltages, VTH of FETs 335 and 375 are approximately zero.

For a logic low input driving phase of the bootstrapping driver, node 325 is pulled up to node 340 via resistor 330 and hence, FETs 365 and 394 start to turn on. The gate-to-source voltage on high side FET 394 will be charged by the voltage across bootstrap capacitor 380 added to the voltage across bootstrap capacitor 345. The gate-to-source voltage on high side FET 394 can be derived as:

$$V_{GS\_394}=3V_{dd} \cdot C_{380} \cdot C_{345}/[(C_{380}+C_{345})(C_{GS\_394}+C_{345})]$$

The total required bootstrap capacitance, $C_T$, is equal to $C_{380}+C_{345}$.

If the gate-to-source voltage on high side FET 394 ($V_{GS\_394}$) is desired to be equal to $V_{dd}$ with bootstrap capacitors having the same capacitance ($C_{380}=C_{345}=C_{Bootstrap}$), then $C_{Bootstrap}$ will be equal to twice the gate-to-source capacitance of high side FET 394 ($C_{GS\_394}$) and the total bootstrap capacitance $C_T$ will be equal to $4 \cdot C_{GS\_394}$, which is 55% less than the total required capacitance ($9 \cdot C_{GS\_394}$ to achieve $V_{GS\_394}=0.9 \cdot V_{dd}$) in the bootstrap driver circuit of FIG. 1. In addition, the resulting gate-to-source capacitance of high side FET 394 $V_{GS\_394}$ ($=V_{dd}$) is even higher than the one in FIG. 1 ($V_{GS\_394}=0.9 \cdot V_{dd}$), further improving pull-up speed.

In general, N integer number of bootstrap capacitors can be used. Then $V_{GS\_294}=N \cdot V_{dd} \cdot C_{Bootstrap}/(C_{Bootstrap}+N \cdot C_{GS\_394})$ and $C_T=N \cdot C_{Bootstrap}$ can be derived.

Nevertheless, to achieve $V_{GS\_394}=V_{dd}$ with minimum total required capacitance $C_T$, N=2 is optimal. If $V_{GS\_394}=1.5 \cdot V_{dd}$ is desired, the optimal N will be equal to 3 with a minimum $C_T$ of $9 \cdot C_{GS\_394}$.

Figure 4:
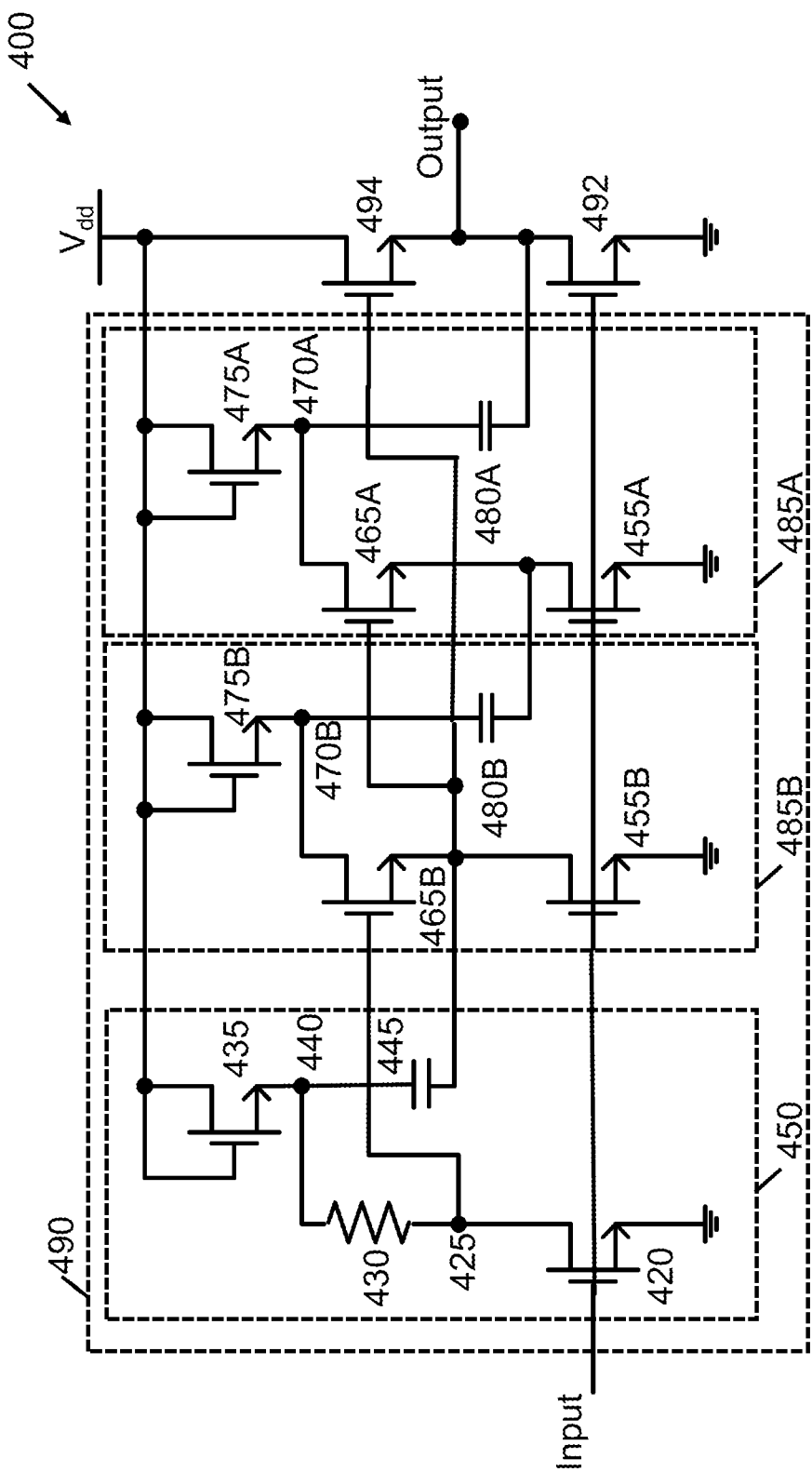
FIG. 4 is a schematic of a cascaded multi-voltage bootstrapping gate driver circuit in accordance with a second embodiment of the present invention.

FIG. 4 illustrates a system 400 according to a second embodiment of the present invention, which includes cascaded bootstrapping gate driver 490, a high side FET 494, a low side (turn-off) FET 492, and an output to be connected to a load (not shown).

Figure 2:
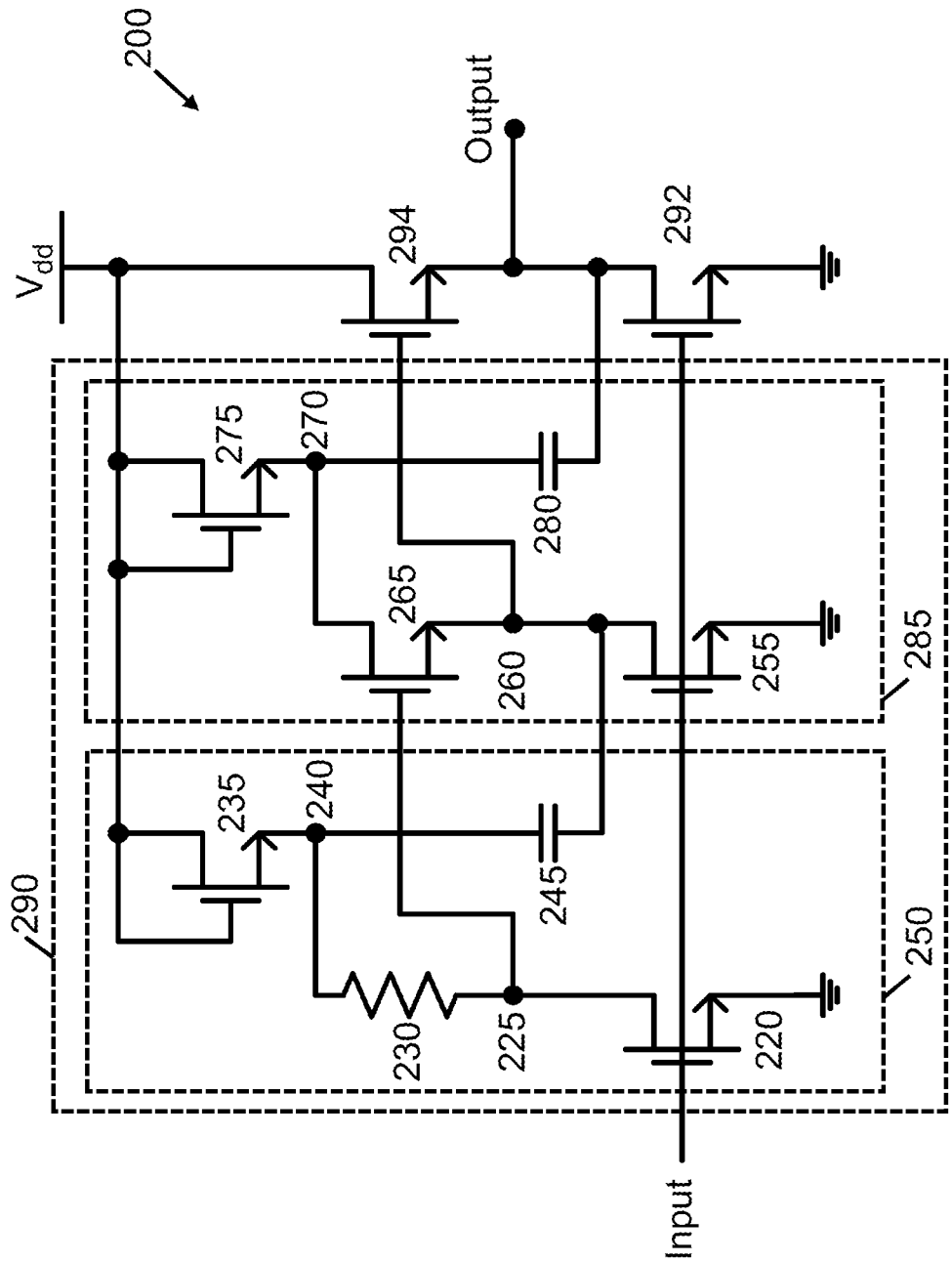
FIG. 2 is a schematic of a conventional cascaded bootstrapping gate driver circuit.

To achieve low power dissipation, in the second embodiment of the invention, the cascaded bootstrapping technique of FIG. 2 is combined into the multi-voltage bootstrapping drivers of FIG. 3 as shown, where like reference numbers in the 400's of FIG. 4 represent corresponding elements in the 300's of FIG. 3, with A and B suffixes added to represent the elements inside two bootstrapping stages in the multi-voltage bootstrapping stage. More specifically, since the combined capacitance for FET 365 and high side FET 394 in the gate driver of FIG. 3 can be quite large, a very small resistor 330 is required to pull the voltage at node 325 up to the voltage at node 340 in the circuit and hence, high DC power dissipation results when the input is logic high.

In the cascaded bootstrapping gate driver of FIG. 4, resistor 330 of FIG. 3 is replaced with a FET 465B to address the above-described logic high input issue. FET 465B has a much smaller size than high side FET 494 and FET 465A. In an alternative embodiment of the circuit of FIG. 4, the gate of FET 465A can be connected to the gate of FET 465B. FET 465B of bootstrapping stage 485B is driven by the circuitry of the preceding stage 450. Since the size of FET 465B is much less that the size of high side FET 494 and FET 465A, bootstrap capacitor 445 can be much smaller than bootstrap capacitors 480A and 480B. Resistor 430 can thus be much larger than resistor 330 to reduce current consumption with a far lower penalty on the turn-on time of FET 465B due to the smaller size of FET 465B. Additional cascaded stages can be used, in the manner described in U.S. Pat. No. 10,790,811, which is incorporated by reference. In other words, the same concept of using multiple bootstrap capacitors can also be applied to replace a single bootstrap capacitor in each cascaded stage, such that the total capacitance requirements in the cascaded stages can also be reduced.

In summary, the multi-voltage bootstrapping driver of the present invention has the following features and advantages over the prior art:

- For a conventional bootstrapping driver, the gate-to-source voltage of the pull-up FET can only be equal to or less than the supply voltage. It also requires a large bootstrap capacitor.
- In the bootstrapping driver of the present invention, the gate-to-source voltage of the pull-up FET is set equal to or higher than the supply voltage.
- In accordance with the present invention, multiple bootstrap capacitors are charged in parallel and connected in series to achieve multiple voltages applied to the gate and source terminals of the pull-up driving FET for logic high output.
- To achieve a gate-to-source voltage equal to the supply voltage, the total required capacitance is 55% less than in the conventional bootstrapping driver that can only achieve 90% of the supply voltage on the gate-to-source voltage. Therefore, the present invention reduces the overall die area significantly.
- The present invention can be combined with the cascaded bootstrapping technique disclosed and claimed in U.S. Pat. No. 10,790,811 to achieve low power consumption.
- The proposed technique can be further combined with the active bootstrapping circuitry of U.S. application Ser. No. 18/062,660 (in addition to the combination of the cascaded bootstrapping circuitry) to further maximize the voltages stored on the bootstrap capacitors to improve the robustness of the overall bootstrapping driver for different process, voltage and temperature variations.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A bootstrapping gate driver for a high side FET having a drain terminal connected to a supply voltage, a source terminal connected to an output, and a gate terminal, the bootstrapping gate driver comprising:
   an input for receiving a control signal; and
   a plurality of bootstrap capacitors electrically connected in parallel between the supply voltage and ground when the control signal corresponds to a charging phase, thereby charging the capacitors, the plurality of bootstrap capacitors being electrically connected in series between the gate and the source of the high side FET when the control signal corresponds to a driving stage;
   whereby the voltage between the gate and the drain of the high side FET is equal to or greater than the supply voltage when the control signal corresponds to the driving stage.

2. The bootstrapping gate driver of claim 1, further comprising a resistor electrically connected between the supply voltage and the gate of the high side FET to decrease static current consumption.

3. The bootstrapping gate driver of claim 1, further comprising a low side FET, the low side FET having a drain terminal connected to the source of the high side FET and the output, a gate terminal connected to the input, and a source terminal connected to ground.

4. The bootstrapping gate driver of claim 2, further comprising an initial stage and a secondary stage, wherein the initial stage includes a first one of said plurality of bootstrap capacitors and the resistor, and the secondary stage includes a second one of said plurality of bootstrap capacitors and a FET.

5. The bootstrapping gate driver of claim 4, wherein the bootstrapping gate driver is cascaded.

6. The bootstrapping gate driver of claim 5, wherein the second secondary stage of the cascaded bootstrapping driver comprises a FET that is smaller than the high side FET, and the secondary stage comprises a FET that is smaller than the FET of the second secondary stage, and wherein the bootstrap capacitor of the initial stage is smaller than the bootstrap capacitors of the secondary stage and the second secondary stage.

7. The bootstrapping gate driver of claim 6, wherein the FETs of the bootstrapping gate driver are gallium nitride (GaN) FETs.

* * * * *